(12) United States Patent  
Nam et al.

(10) Patent No.: US 7,860,468 B2  
(45) Date of Patent: Dec. 28, 2010

(54) PROGRAMMABLE VARIABLE GAIN AMPLIFIER AND RF RECEIVER INCLUDING THE SAME

(75) Inventors: Il-Ku Nam, Anyang-si (KR); Byeong-Ha Park, Seongnam-si (KR); Jong-Dae Bae, Suwon-si (KR); Jung-Wook Heo, Yongin-si (KR); Ho-Jung Ju, Seoul (KR); Hyun-Won Mun, Yongin-si (KR); Jeong-Hyun Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 674 days.

(21) Appl. No.: 11/933,504

(22) Filed: Nov. 1, 2007

(65) Prior Publication Data

US 2008/0119154 A1    May 22, 2008

(30) Foreign Application Priority Data

Nov. 2, 2006    (KR) ...................... 10-2006-0107537

(51) Int. Cl.  
*H04B 1/04* (2006.01)  
*H04B 1/06* (2006.01)

(52) U.S. Cl. ................ 455/127.2; 455/127.3; 455/253.2

(58) Field of Classification Search .............. 455/114.2, 455/114.3, 115.1, 127.2, 127.3, 91, 234.1, 455/232.1, 240.1, 241.1, 253.1; 330/296, 330/254  
See application file for complete search history.

(56) References Cited

U.S. PATENT DOCUMENTS

| | | | |
|---|---|---|---|
| 6,621,343 B2 * | 9/2003 | Hart ........................... 330/254 |
| 6,711,391 B1 * | 3/2004 | Walker et al. ............. 455/234.1 |
| 6,882,226 B2 | 4/2005 | Cho et al. |
| 6,927,629 B2 * | 8/2005 | Tomita ........................ 330/252 |
| 7,202,741 B2 * | 4/2007 | Park et al. .................... 330/254 |
| 7,215,200 B1 * | 5/2007 | Hauser ........................ 330/259 |
| 7,276,973 B2 * | 10/2007 | Ripley et al. ................ 330/296 |
| 7,414,479 B2 * | 8/2008 | Ripley et al. ................ 330/296 |
| 7,746,172 B1 * | 6/2010 | Kobayashi .................. 330/260 |
| 2005/0057306 A1 | 3/2005 | Gaeta et al. |

FOREIGN PATENT DOCUMENTS

| KR | 1020040047171 A | 6/2004 |
|---|---|---|
| KR | 1020060014758 A | 2/2006 |
| KR | 1020060039801 A | 5/2006 |

* cited by examiner

*Primary Examiner*—Sonny Trinh  
(74) *Attorney, Agent, or Firm*—Volentine & Whitt, P.L.L.C.

(57) ABSTRACT

A programmable variable gain amplifier includes at least three amplifiers. A first amplifier is configured to amplify an input signal. A second amplifier, which includes a programmable output load stage, is configured to receive an output signal from the first amplifier and to output a first differential output signal. The output load stage includes multiple first switches and multiple first diode-connected transistors that are open-circuited or short-circuited by the first switches. A third amplifier, which includes a programmable current mirror input stage, is configured to receive the first differential output signal from the second amplifier through the current mirror input stage and to output a second differential output signal. The current mirror input stage includes multiple second switches and multiple second transistors that are open-circuited or short-circuited by the plurality of second switches. The second transistors respectively form current mirrors with the first diode-connected transistors corresponding to the second transistors.

20 Claims, 6 Drawing Sheets

PROGRAMMABLE VARIABLE GAIN AMPLIFIER AND RF RECEIVER INCLUDING THE SAME

CROSS-REFERENCE TO RELATED APPLICATIONS

A claim of priority is made to Korean Patent Application No. 10-2006-0107537, filed on Nov. 2, 2006, the subject matter of which is hereby incorporated by reference.

BACKGROUND OF THE INVENTION

1. Field of the Invention

The present invention relates to a radio frequency (RF) receiver, and more particularly, to a programmable variable gain amplifier (PVGA) and an RF receiver including the programmable variable gain amplifier.

2. Description of the Related Art

A variable gain amplifier is used for maintaining an expected output signal level by adjusting a gain, and is widely used in RF receivers. Recently, there has been research on variable gain amplifiers, resulting in the development of various variable gain amplifiers. Moreover, there has been recent research on precisely adjusting a gain applicable to a low-voltage operation.

A variable gain amplifier disclosed in U.S. Pat. No. 6,882,226, issued Apr. 19, 2005, controls a gain and linearity by changing the resistances of a source degeneration variable resistor and a load degeneration variable resistor by an amplification unit included in the variable gain amplifier. Accordingly, the linearity of the variable gain amplifier may be improved.

However, in the variable gain amplifier disclosed in the U.S. Pat. No. 6,882,226, a DC voltage of an output node is varied by changing the resistances. Thus, an output current is varied. Moreover, a large resistance deteriorates wide-band characteristics of an RF receiver.

SUMMARY OF THE INVENTION

An aspect of the present invention provides a programmable variable gain amplifier that includes a first amplifier, a second amplifier and a third amplifier. The first amplifier is configured to amplify an input signal. The second amplifier, which includes a programmable output load stage, is configured to receive an output signal from the first amplifier and to output a first differential output signal. The output load stage includes multiple first switches and multiple first diode-connected transistors that are open-circuited or short-circuited by the first switches. The third amplifier, which includes a programmable current mirror input stage, is configured to receive the first differential output signal from the second amplifier through the current mirror input stage and to output a second differential output signal. The current mirror input stage includes multiple second switches and multiple second transistors that are open-circuited or short-circuited by the second switches. The second transistors respectively form current mirrors with the first diode-connected transistors corresponding to the second transistors. A gain of the programmable variable gain amplifier may be determined by a size ratio between one of the first diode-connected transistors and one of the second transistors. The second amplifier may be AC-coupled to the third amplifier.

The programmable variable gain amplifier may further include at least one additional amplifier having substantially the same configuration as the third amplifier. The at least one additional amplifier may be coupled to an output stage of the third amplifier. For example, an end additional amplifier may be AC-coupled to the third amplifier or, when there is more than one additional amplifier, to an adjacent additional amplifier.

The first diode-connected transistors may be paired to form multiple first transistor pairs. Each first transistor pair may be open-circuited or short-circuited by one first switch of the multiple first switches, or each first diode-connected transistor within each first transistor pair may be open-circuited or short-circuited by one first switch. Also, the second transistors may be paired to form multiple second transistor pairs. Each second transistor pair may be open-circuited or short-circuited by one second switch of the multiple second switches, or each second transistor within each second transistor pair may be open-circuited or short-circuited by one second switch.

Another aspect of the present invention provides a radio frequency (RF) receiver that includes a first amplifier, a second amplifier, a third amplifier and a mixer. The first amplifier is configured to amplify an input signal. The second amplifier, which includes an output load stage, is configured to receive an output signal from the first amplifier and to output a first differential output signal. The output load stage includes multiple first switches and multiple first diode-connected transistors that are open-circuited or short-circuited by the first switches. The third amplifier, which includes a current mirror input stage, is configured to receive the first differential output signal from the second amplifier through the current mirror input stage and to output a second differential output signal. The current mirror input stage includes multiple second switches and multiple second transistors that are open-circuited or short-circuited by the second switches. The second transistors respectively form current mirrors with the first diode-connected transistors corresponding to the second transistors. The mixer is configured to mix the second differential output signal and a local oscillation signal. The mixer may include an I-mixer and a Q-mixer for a quadrature amplitude modulation (QAM).

A gain of the RF receiver may be based on a size ratio between one of the first diode-connected transistors and one of the second transistors. Also, the second amplifier may be AC-coupled to the third amplifier.

The RF receiver may further include at least one additional amplifier having substantially the same configuration as the third amplifier. The at least one additional amplifier may be coupled to an output stage of the third amplifier. For example, an end additional amplifier may be AC-coupled to the third amplifier or, when there are multiple additional amplifiers, to an adjacent additional amplifier. The mixer may be AC-coupled to the end additional amplifier.

The first diode-connected transistors may be paired to form multiple first transistor pairs. Each first transistor pair may be open-circuited or short-circuited by one first switch of the multiple first switches, or each first diode-connected transistor within each first transistor pair may be open-circuited or short-circuited by one first switch. Also, the second transistors may be paired to form multiple second transistor pairs. Each second transistor pair may be open-circuited or short-circuited by one second switch of the multiple second switches, or each second transistor within each second transistor pair may be open-circuited or short-circuited by one second switch.

BRIEF DESCRIPTION OF THE DRAWINGS

The embodiments of the present invention will be described with reference to the attached drawings, in which.

DESCRIPTION OF THE EMBODIMENTS

Figure 1:
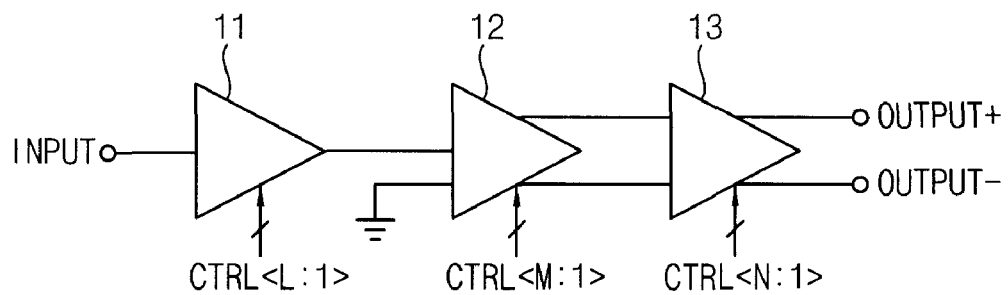
FIG. 1 is a block diagram illustrating a programmable variable gain amplifier, according to an exemplary embodiment of the present invention.

The present invention now will be described more fully with reference to the accompanying drawings, in which exemplary embodiments of the invention are shown. This invention may, however, be embodied in various different forms, and should not be construed as being limited to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

It will be understood that, although the terms first, second, etc., may be used herein to describe various elements, these elements should not be limited by these terms. These terms are used merely to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having meanings consistent with their meanings in the context of the relevant art and will not be interpreted in an idealized or overly formal sense unless expressly so defined herein.

FIG. 1 is a block diagram generally illustrating a programmable variable gain amplifier, according to an exemplary embodiment of the present invention.

Referring to FIG. 1, the programmable variable gain amplifier includes first, second and third amplification units 11, 12 and 13. The first, second and third amplification units 11, 12 and 13 receive control signals Ctrl<L:1 >, Ctrl<M:1 > and Ctrl<N:1 >, respectively, for controlling a gain of each amplification unit. The programmable variable gain amplifier receives a signal, e.g., from an external circuit, such as an antenna or the like, as an INPUT and provides a differential output signal, OUTPUT+ and OUTPUT−.

As discussed below, an output load stage of the second amplification unit 12 includes a diode-connected transistor (e.g., a PMOS transistor) and a switch. A whole gain of the programmable variable gain amplifier may be programmed by the output load stage of the second amplification unit 12 with a current mirror input stage of the third amplification unit 13. The whole gain of the programmable variable gain amplifier is determined by a size ratio between the diode-connected transistor, which is included in the output load stage of the second amplification unit 12, and a diode-connected transistor (e.g., a PMOS transistor), which is included in the current mirror input stage of the third amplification unit 13. The second amplification unit 12 and the third amplification unit 13 are configured to form an AC-coupled current mirror.

The first amplification unit 11 may be a low-noise amplifier that amplifies a signal input from an external circuit, such as an antenna. In general, a low-noise amplifier that is used as the first amplification unit 11 may be implemented with a feedback-type amplifier to receive a wide-band signal. Moreover, a common-source type low-noise amplifier may be used in low bandwidth environments, such as T-DMB, ISDB-T, DVB-H, etc.

Figure 2:
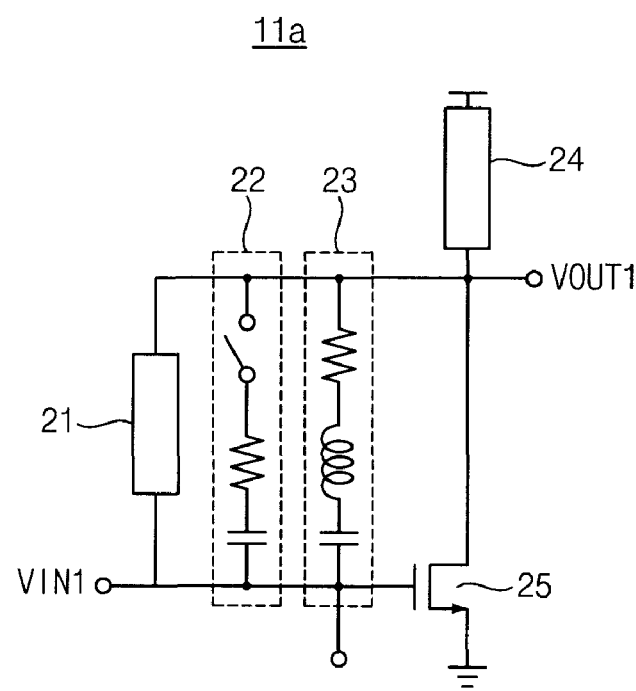
FIG. 2 is a circuit diagram illustrating a first amplification unit of FIG. 1, according to an exemplary embodiment of the present invention.

FIG. 2 is a circuit diagram illustrating an example of a first amplification unit of FIG. 1, according to an exemplary embodiment of the present invention.

Referring to FIG. 2, the first amplification unit 11a receives an input signal VIN1, which may correspond to the INPUT of FIG. 1, and outputs an output signal VOUT1. The first amplification unit 11a includes a first feedback unit 23, a second feedback unit 22, an amplifying unit 25, an attenuation unit 21 and a load unit 24.

The first amplification unit 11a may support a high-gain mode, or may simultaneously support the high-gain mode as well as a low-gain mode. As impedances of the first and second feedback units 22 and 23 are increased, the amount of feedback is decreased and thus a large gain can be obtained.

Therefore, the first feedback unit 23, having a large impedance, supports the high-gain mode with the amplifying unit 25. The second feedback unit 22, having an impedance smaller than the impedance of the first feedback unit 23, supports a mid-gain mode with the amplifying unit 25. The attenuation unit 21 may include a bypass device, a resistance divider and a switching device. The attenuation unit 21 may be configured to have a desired impedance by the switching device, and supports a low-gain mode. Therefore, the first amplification unit 11a may constitute a programmable variable gain amplifier having a low-noise characteristic and a large dynamic range.

Figure 3:
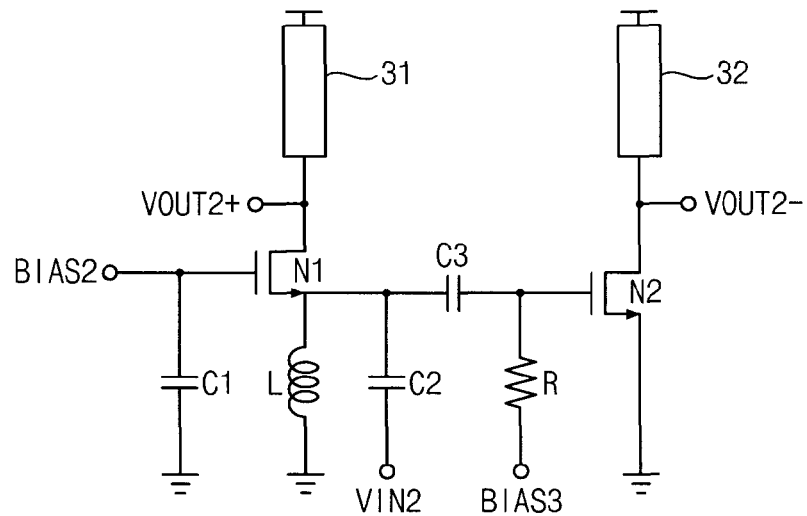
FIG. 3 is a circuit diagram illustrating a second amplification unit of FIG. 1, according to an exemplary embodiment of the present invention.

FIG. 3 is a circuit diagram illustrating an example of a second amplification unit of FIG. 1.

Referring to FIG. 3, the second amplification unit 12a receives a single input signal VIN2, e.g., corresponding to the output signal VOUT1 of the first amplifying unit 11a, and outputs differential output signals VOUT2+ and VOUT2−. The output nodes for VOUT2+ and VOUT2− are respectively connected to sources/drains of transistors N1 and N2 and to load units 31 and 32.

The transistor N1 is gated to a bias signal BIAS2 and a capacitor C1, which is connected to a ground voltage. The other source/drain of the transistor N1 is connected to the ground voltage via an inductor L and to a gate of the transistor N2 via a capacitor C3. The transistor N2 is gated to a bias signal BIAS3 via a resistor R. The other source/drain of the transistor N2 is connected to the ground voltage. The input signal VIN2 is provided to the source/drain of the transistor N1 and the gate of the transistor N2 via a capacitor C2. The second amplification unit 12a may be referred to as an active balun.

The load units 31 and 32 in the second amplification unit 12a illustrated in FIG. 3 may include resistors (not shown), such that a gain of the second amplification unit 12a is controlled by adjusting resistances of the resistors.

In a conventional variable gain amplifier, adjusting the resistances of an amplification unit, such as the second amplification unit 12a< may have negative effects. For example, DC voltages VOUT2+ and VOUT2− of the output nodes and/or drain voltages of transistors N1 and N2 are varied by adjusting the resistances. Therefore, output currents also may be varied by the varied output voltages in sub-μm CMOS technologies. Moreover, a large resistance may deteriorate wide-band characteristics.

Accordingly, in various embodiments of the present invention, e.g., as described with reference to FIGS. 4 and 5, example configurations of the second amplification unit 12 in FIG. 1, as well as the relative connections among the amplification units, are provided to avoid such negative effects and to enhance the performance of the programmable variable gain amplifier.

Figure 4:
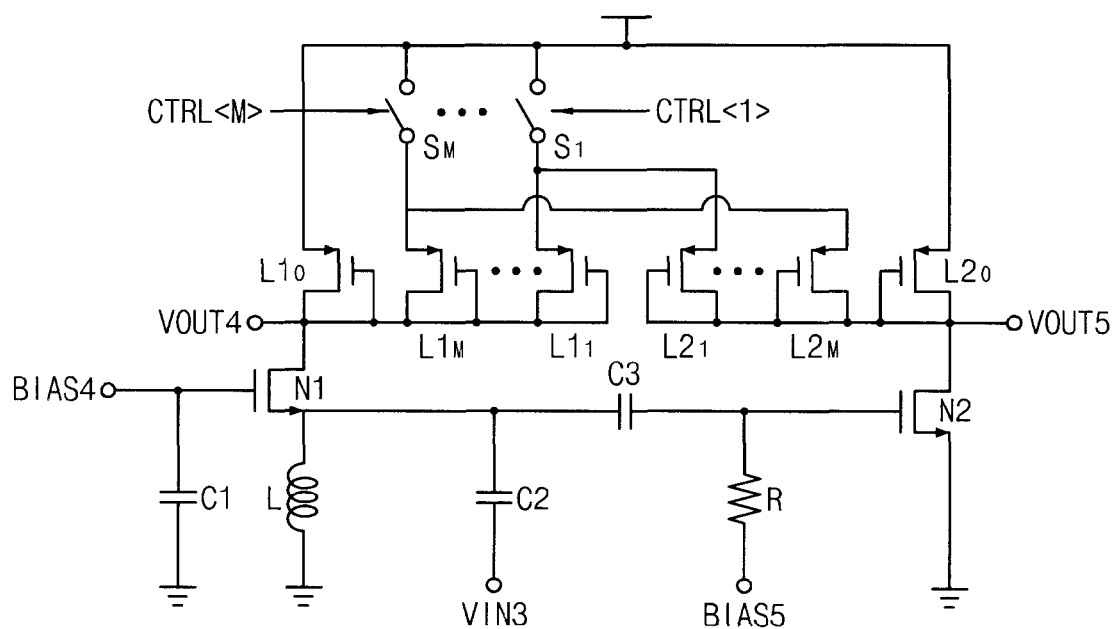
FIG. 4 is a circuit diagram illustrating a second amplification unit of FIG. 1, according to an exemplary embodiment of the present invention.

FIG. 4 is a circuit diagram illustrating a detailed example of a second amplification unit of FIG. 1, according to an exemplary embodiment of the present invention.

Referring to FIG. 4, the second amplification unit 12b may include diode-connected PMOS transistors $L1_0$ and $L2_0$, which correspond to the load units 31 and 32 shown in FIG. 3. Likewise, differential output signals VOUT4 and VOUT5 substantially correspond to VOUT2+ and VOUT2−, and bias signals BIAS4 and BIAS5 respectively correspond to BIAS2 and BIAS3, shown in FIG. 3. In addition, the detailed second amplification unit 12b further depicts multiple diode-connected PMOS transistors $L1_1$ through $L1_M$ and $L2_1$ through $L2_M$, which are connected in parallel with the two diode-connected PMOS transistors $L1_0$ and $L2_0$.

The diode-connected PMOS transistors $L1_1$ through $L1_M$ and $L2_1$ through $L2_M$ are paired to form M pairs of PMOS transistors, and each pair of PMOS transistors outputs a differential signal. The two PMOS transistors of each pair are open-circuited or short-circuited to a power supply voltage by the same switch (e.g., one of switches $S_1$ through $S_M$). The switches $S_1$ through $S_M$ are controlled in response to control signals Ctrl<1> through Ctrl<M>, respectively.

A whole gain of the programmable variable gain amplifier may be programmable by a configuration having the diode-connected PMOS transistors $L1_1$ through $L1_M$ and $L2_1$ through $L2_M$ and the switches $S_1$ through $S_M$, along with a current mirror input stage of a third amplification unit, described below. The whole gain of the programmable variable gain amplifier is determined by a size ratio between one of the diode-connected PMOS transistors $L1_1$ through $L1_M$ and $L2_1$ through $L2_M$ and one of PMOS transistors included in the current mirror input stage of the third amplification unit 13.

In the second amplification unit 12b illustrated in FIG. 4, an input stage includes two NMOS transistors N1 and N2, and an output stage includes PMOS transistors $L1_0$, $L2_0$, $L1_1$ through $L1_M$, and $L2_1$ through $L2_M$. Alternatively the input stage may include PMOS transistors and the output stage may include NMOS transistors, in which case, the current mirror input stage of the third amplification unit 13 would include NMOS transistors.

Figure 5:
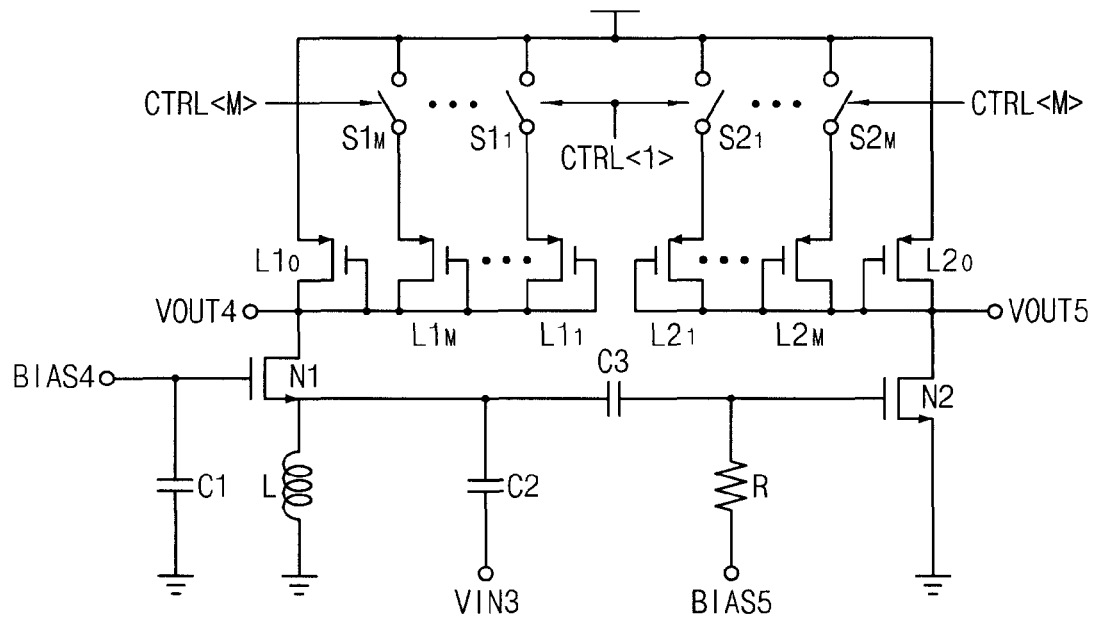
FIG. 5 is a circuit diagram illustrating still a second amplification unit of FIG. 1, according to an exemplary embodiment of the present invention.

FIG. 5 is a circuit diagram illustrating another detailed example of a second amplification unit of FIG. 1, according to an exemplary embodiment of the present invention.

Referring to FIG. 5, In comparison with the second amplification unit 12b illustrated in FIG. 4, the second amplification unit 12c includes additional more switches in the output load stage than the second amplification unit 12b illustrated in FIG. 4. In particular, each pair of the diode-connected PMOS transistors $L1_1$ through $L1_M$ and $L2_1$ through $L2_M$ is open-circuited or short-circuited to a power supply voltage by a switch, as in FIG. 4, but each PMOS transistor in FIG. 5 is respectively coupled to a corresponding switch in FIG. 5. For example, PMOS transistors $L1_1$ through $L1_M$ and $L2_1$ through $L2_M$ are respectively coupled to switches $S1_1$ through $S1_M$ and $S2_1$ through $S2_M$.

Figure 6:
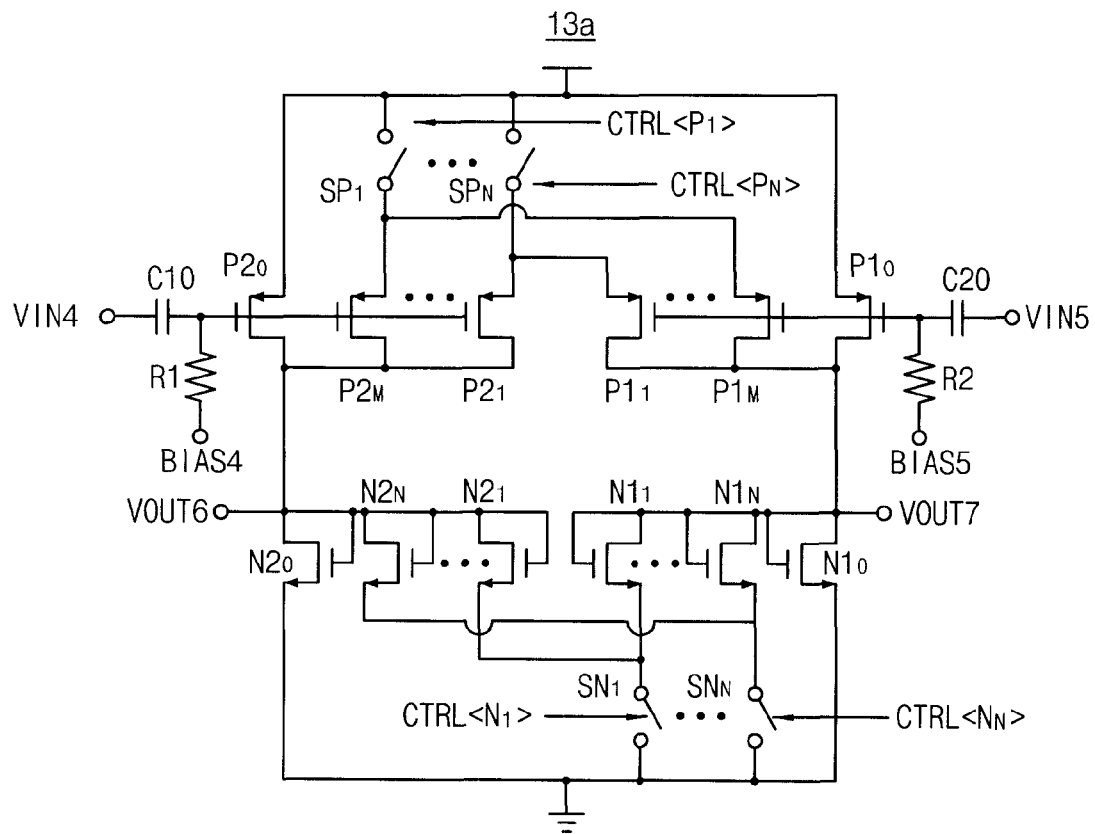
FIG. 6 is a circuit diagram illustrating a third amplification unit of FIG. 1, according to an exemplary embodiment of the present invention.

FIG. 6 is a circuit diagram illustrating an example of a third amplification unit of FIG. 1, according to an exemplary embodiment of the present invention.

Referring to FIG. 6, an input stage of the third amplification unit 13a includes multiple PMOS transistors $P2_1$ through $P2_M$ and $P1_1$ through $P1_M$, which form current mirrors, and switches $SP_1$ through $SP_N$. The switches $SP_1$ through $SP_N$ are controlled by the control signals CTRL<$P_1$> through CTRL<$P_N$>, respectively. An output stage of the third amplification unit 13a includes multiple NMOS transistors $N2_1$ through $N2_N$ and $N1_1$ through $N1_N$, each of which forms a diode, and switches $SN_1$ through $SN_N$. The switches $SN_1$ through $SN_N$ are controlled by the control signals $CTRL<N_1>$ through $CTRL<N_N>$, respectively. The output signals VOUT6 and VOUT7 are respectively output from nodes of the output stage connected to sources/drains of transistors $N2_0$ and $N1_0$.

In the exemplary third amplification unit 13a illustrated in FIG. 6, the input stage includes PMOS transistors, and the output stage includes NMOS transistors. Alternatively, as discussed above, the input stage may include NMOS transistors and the output stage may include PMOS transistors, without departing from the spirit and scope of the present invention.

Further, in another example of the third amplification unit of FIG. 1, the PMOS transistors $P2_1$ through $P2_M$ and $P1_1$ through $P1_M$ included in the input stage and the NMOS transistors $N2_1$ through $N2_N$ and $N1_1$ through $N1_N$ included in the output stage may each be coupled to a corresponding switch, as opposed to being coupled in pairs, similar to the output stage illustrated in FIG. 5.

As described above, the whole gain of the programmable variable gain amplifier may be programmed by the current mirror input stage of the third amplification unit 13a with the output stage of the second amplification unit 12. The whole gain of the programmable variable gain amplifier is determined by size ratios between transistors forming current mirrors.

The current mirror input stage of the third amplification unit 13a may be AC-coupled to the output stage of the second amplification unit 12 by capacitors C10 and C20, through which the input signals VIN 4 and VIN 5 are received. The transistor $P2_0$ is gated to the capacitor C10 and to the bias signal BIAS4 through a resistor R1. Similarly, the transistor $P1_0$ is gated to the capacitor C20 and to the bias signal BIAS5 through a resistor R2. DC currents are adjusted to a desired bias by the AC-couplings, thereby consumption of the DC currents that are not related to AC signals may be reduced.

The programmable variable gain amplifiers described above may be used in a tuner of an RF receiver, for example. Accordingly, various example embodiments of RF receivers, including the programmable variable gain amplifiers are described below.

Figure 7:
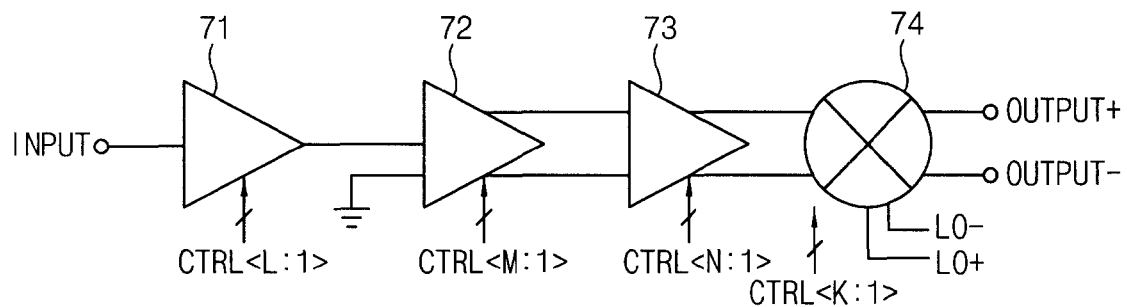
FIG. 7 is a block diagram illustrating an RF receiver including a programmable variable gain amplifier, according to an exemplary embodiment of the present invention.

FIG. 7 is a block diagram illustrating an RF receiver including a programmable variable gain amplifier, according to an exemplary embodiment of the present invention.

Referring to FIG. 7, the RF receiver includes first, second and third amplification units 71, 72 and 73, constituting a programmable variable gain amplifier, and a mixing unit 74. The first, second and third amplification units 71, 72 and 73 are substantially the same as the first, second and third amplification units 11, 12 and 13 of FIG. 1, and therefore a detailed description of the amplification units will not be repeated. The mixing unit 74 outputs a mixed signal OUTPUT+ and OUTPUT− corresponding to a difference between an output signal of the third amplification unit 73 and an oscillation signal LO+ and LO−, e.g., from a local oscillator. In various embodiments, the third amplification unit 73 may be excluded and an output of the second amplification unit 72 may be provided directly to the mixing unit 74, without departing from the spirit and scope of the present invention.

The mixing unit 74 illustrated in FIG. 7 may have a similar configuration as current mirror configurations of the programmable variable gain amplifier, such that the mixing unit 74 is controlled by a control signal $Ctrl<K:1>$.

Figure 8:
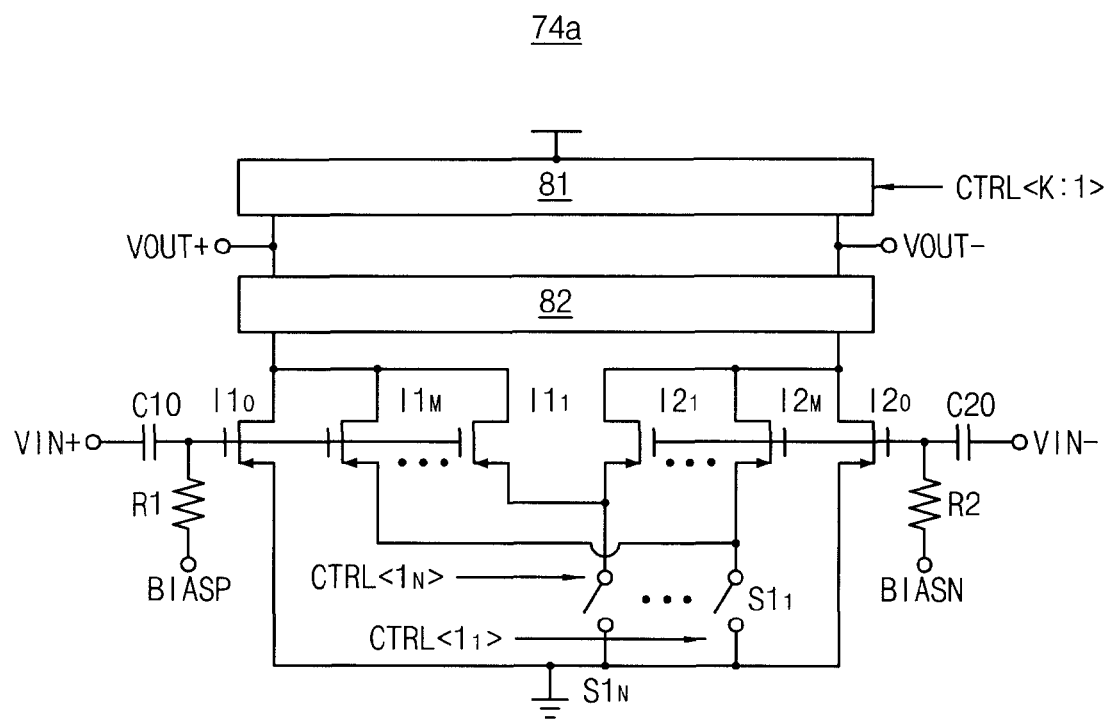
FIG. 8 is a circuit diagram illustrating a mixing unit of FIG. 7, according to an exemplary embodiment of the present invention.

FIG. 8 is a circuit diagram illustrating an example mixing unit of FIG. 7, according to an exemplary embodiment of the present invention.

Referring to FIG. 8, a mixing unit 74a includes a load unit 81, a switching unit 82, multiple switches $S1_1$ through $S^1N$, and a differential input stage having multiple transistors $I1_0$, $I2_0$, and $I1_1$ through $I1_M$, and $I2_1$ through $I2_M$ forming current mirrors. The switches $S1_1$ through $S1_N$ may be controlled by control signals $Ctrl<1_1>$ through $Ctrl<I_N>$, respectively. The mixing unit 74a may be AC-coupled to the third amplification unit 73 by capacitors C10 and C20 of the mixing unit 74a, through which input signals VIN+ and VIN− are received. The transistor $I1_0$ is gated to the capacitor C10 and to a bias signal BIASP through a resistor R1. Similarly, the transistor $I2_0$ is gated to the capacitor C20 and to a bias signal BIASN through a resistor R2.

A gain of the whole circuit may be programmed by the differential input stage of the mixing unit 74a with an output stage of the third amplification unit 73 that is AC-coupled to the differential input stage of the mixing unit 74a. The gain of the whole circuit is determined by size ratios between transistors forming current mirrors.

In various embodiments, the RF receivers may include two separate mixing units for I-phase and Q-phase, respectively.

Figure 9:
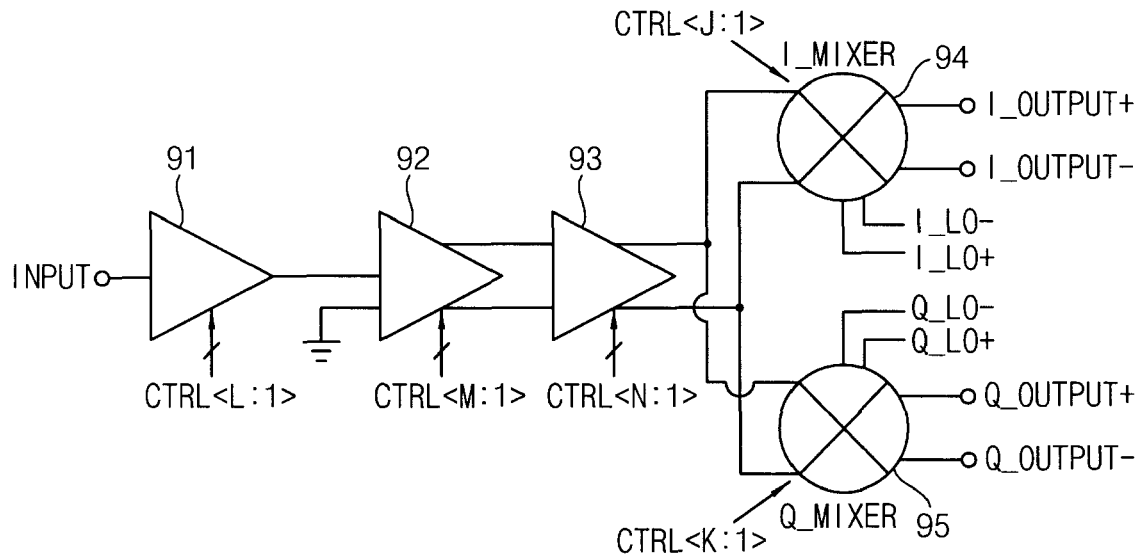
FIG. 9 is a block diagram illustrating an RF receiver including a programmable variable gain amplifier, according to an exemplary embodiment of the present invention.

FIG. 9 is a block diagram illustrating an RF receiver including a programmable variable gain amplifier, according to an exemplary embodiment of the present invention.

Referring to FIG. 9, the RF receiver includes first, second and third amplification units 91, 92 and 93, an I-mixing unit 94, and a Q-mixing unit 95. The RF receiver receives an INPUT signal that is modulated, for example, by a quadrature amplitude modulation (QAM). The first, second and third amplification units 91, 92 and 93 are substantially the same as the first, second and third amplification units 71, 72 and 73 described above with respect to FIG. 7.

Likewise, each of the I-mixing unit 94 and the Q-mixing unit 95 are substantially the same as the mixer 74, except that the I-mixing unit 94 receives I signals and outputs a mixed signal I-OUTPUT+ and I-OUTPUT− corresponding to a difference between an output signal of the third amplification unit 93 and an oscillation signal L_LO+ and I_LO−, and the Q-mixing unit 95 receives Q signals and outputs a mixed signal Q-OUTPUT+ and Q-OUTPUT− corresponding to a difference between an output signal of the third amplification unit 93 and an oscillation signal Q_LO+ and Q_LO−.

Figure 10:
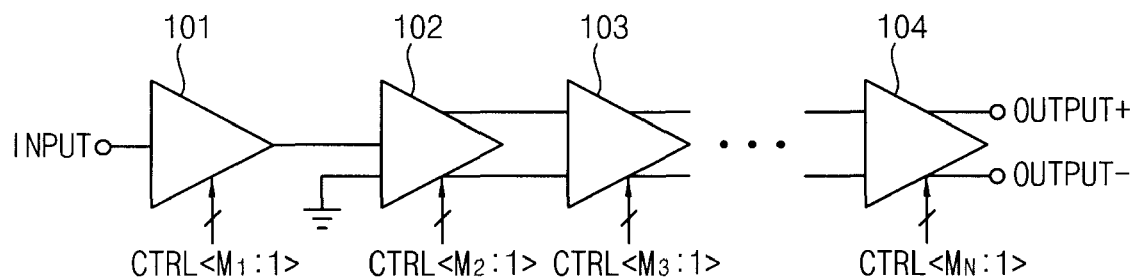
FIG. 10 is a block diagram illustrating a programmable variable gain amplifier, according to an exemplary embodiment of the present invention.

FIG. 10 is a block diagram illustrating a programmable variable gain amplifier, according to another exemplary embodiment of the present invention.

Referring to FIG. 10, the programmable variable gain amplifier includes first, second and third amplification units 101, 102 and 103, with are substantially the same as the amplification units 11, 12 and 13 described above with reference to FIG. 1. The first, second and third amplification units 101, 102 and 103 receive control signals $Ctrl<M_1:1>$, $Ctrl<M_2:1>$ and $Ctrl<M_3:1>$, respectively, for controlling a gain of each amplification unit.

In addition, an output stage of the third amplification unit 103 is coupled to one or more additional amplification units (e.g., fourth amplification unit 104) having substantially the same configuration as the third amplification unit 103. The amplification unit(s) coupled to the output stage of the third amplification unit 103 may be referred to as an N-th amplification unit 104, where N is a natural number greater than or equal to four. The N-th amplification unit 104 receives a control signal $Ctrl<M_N:1>$ for controlling a gain of the amplification unit.

Therefore, a gain of the whole circuit may be programmable by a current mirror input stage of the N-th amplification unit 104 with an output stage of an adjacent preceding amplification unit, e.g., the third amplification unit 103 or an adjacent additional amplification unit N−1 (not shown). The gain of the whole circuit is determined by size ratios between transistors forming current mirrors. The current mirror input stage of the N-th amplification unit 104 is AC-coupled to the output stage of a preceding amplification unit.

Figure 11:
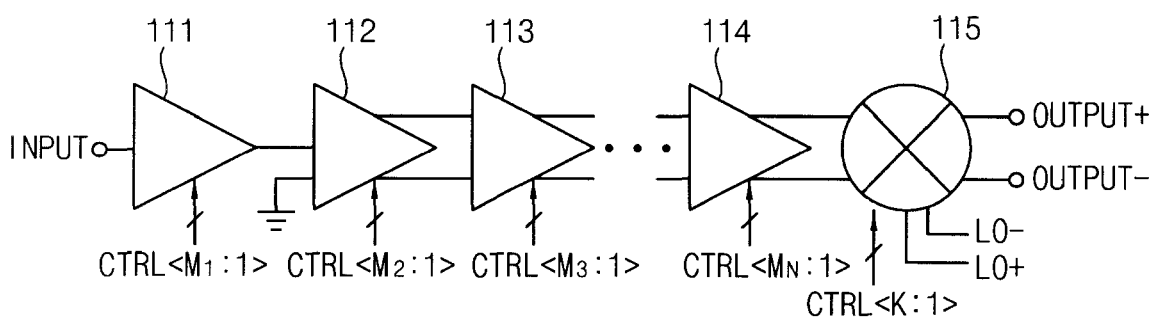
FIG. 11 is a block diagram illustrating an RF receiver including amplification units and one mixing unit, according to an exemplary embodiment of the present invention.

FIG. 11 is a block diagram illustrating an RF receiver including N amplification units and one mixing unit, according to an exemplary embodiment of the present invention.

Referring to FIG. 11, a mixing unit 115 is coupled to an output stage of the programmable variable gain amplifier illustrated in FIG. 10, where the first, second, third and N-th amplification units 111, 112, 113 and 114 of FIG. 11 are substantially the same as the first, second, third and N-th amplification units 101, 102, 103 and 104 of FIG. 10. Likewise, the mixing unit 115 is substantially the same as the mixing unit 74 described above with respect FIG. 7. Accordingly, since configurations and operations of the RF receiver, including the mixing unit 115, are similar to those of the RF receivers described above with respect to FIGS. 7-10, detailed descriptions of the configurations and operations of the RF receiver illustrated in FIG. 11 will not be repeated.

Figure 12:
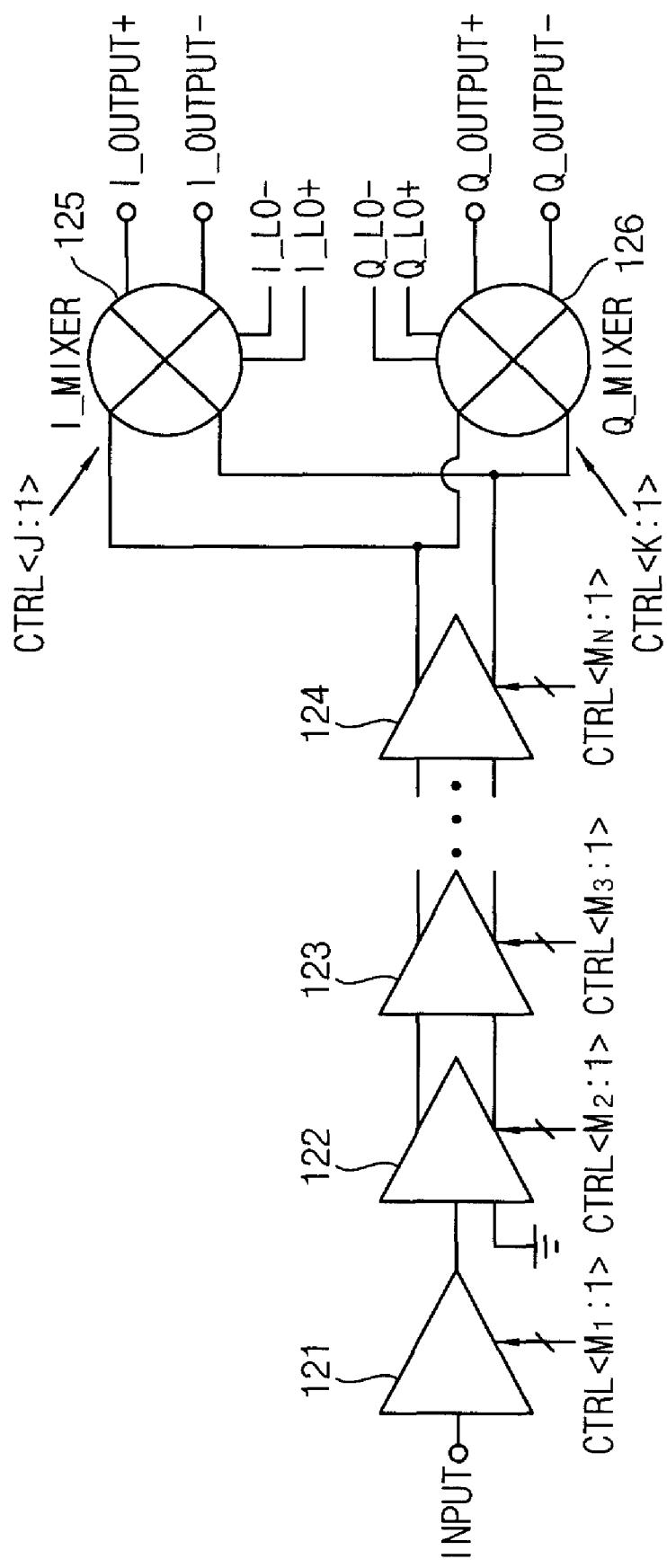
FIG. 12 is a block diagram illustrating an RF receiver including amplification units and two mixing units, according to an exemplary embodiment of the present invention.

FIG. 12 is a block diagram illustrating an RF receiver including N amplification units and two mixing units, according to an exemplary embodiment of the present invention.

Referring to FIG. 12, an I-mixing unit 125 and a Q-mixing unit 126 are coupled to an output stage of the programmable variable gain amplifier illustrated in FIG. 10, where the first, second, third and N-th amplification units 121, 122, 123 and 124 of FIG. 12 are substantially the same as the first, second, third and N-th amplification units 101, 102, 103 and 104 of FIG. 10. Likewise, the I-mixing unit 125 and the Q-mixing unit 126 are substantially the same as the I-mixing unit 94 and the Q-mixing unit 95 described above with respect FIG. 9. Accordingly, since configurations and operations of the RF receiver, including the I-mixing unit 125 and the Q-mixing unit 126, are similar to those of the RF receivers described above with respect to FIGS. 7-10, detailed descriptions of the configurations and operations of the RF receiver illustrated in FIG. 12 will not be repeated.

As discussed above, the programmable variable gain amplifier according to exemplary embodiments of the present invention may include a second amplification unit, which includes an output load stage having diode-connected PMOS transistors and switches. The whole gain of the programmable variable gain amplifier may be programmed by the output load stage of the second amplification unit with a current mirror input stage of a third amplification unit. The whole gain of the programmable variable gain amplifier is determined by a size ratio between one of PMOS transistors included in the output load stage and one of PMOS transistors included in the current mirror input stage. The second amplification unit is AC-coupled to the third amplification unit forming current mirrors with the second amplification, and thus improving wide-band characteristics and low-voltage characteristics of the programmable variable gain amplifier.

Moreover, an RF receiver according to exemplary embodiments of the present invention includes at least one mixing unit coupled to the output stage of the programmable variable gain amplifier. Therefore, wide-band characteristics and low-voltage characteristics of the RF receiver are improved.

Further, the examples described above disclose various applications of the programmable variable gain amplifier, which include mixers. However, the programmable variable gain amplifier may also apply to any circuits forming a front-end of a receiver, such as a tuner, without departing from the spirit and scope of the present invention.

Also, in the examples described above, an input signal is described as a single-ended signal. However, the present invention may also apply to differential input signals, without departing from the spirit and scope of the present invention.

Therefore, according to various embodiments of the present invention, the programmable variable gain amplifier may operate at low voltages, and the RF receiver may achieve wide-band characteristics, thereby improving the performance of chips including the programmable variable gain amplifier or the RF receiver.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A programmable variable gain amplifier, comprising:
   a first amplifier configured to amplify an input signal;
   a second amplifier comprising a programmable output load stage, the second amplifier being configured to receive an output signal from the first amplifier and to output a first differential output signal, the output load stage comprising a plurality of first switches and a plurality of first diode-connected transistors that are open-circuited or short-circuited by the plurality of first switches; and
   a third amplifier comprising a programmable current mirror input stage, the third amplification unit being configured to receive the first differential output signal from the second amplifier through the current mirror input stage and to output a second differential output signal, the current mirror input stage comprising a plurality of second switches and a plurality of second transistors that are open-circuited or short-circuited by the plurality of second switches,
   wherein the plurality of second transistors respectively form current mirrors with the plurality of first diode-connected transistors corresponding to the second transistors.

2. The programmable variable gain amplifier of claim 1, wherein a gain of the programmable variable gain amplifier is determined by a size ratio between one of the first diode-connected transistors and one of the second transistors.

3. The programmable variable gain amplifier of claim 1, wherein the second amplifier is AC-coupled to the third amplifier.

4. The programmable variable gain amplifier of claim 3, further comprising:
   at least one additional amplifier having substantially the same configuration as the third amplifier, the at least one additional amplifier being coupled to an output stage of the third amplifier.

5. The programmable variable gain amplifier of claim 4, wherein an end amplifier of the at least one additional amplifier is AC-coupled to one of the third amplifier or an adjacent additional amplifier of the at least one additional amplifier.

6. The programmable variable gain amplifier of claim 1, wherein the plurality of first diode-connected transistors are paired to form a plurality of first transistor pairs, each first transistor pair being open-circuited or short-circuited by one first switch of the plurality of first switches.

7. The programmable variable gain amplifier of claim 1, wherein the plurality of first diode-connected transistors are paired to form a plurality of first transistor pairs, each first diode-connected transistor of each of the plurality of first transistor pairs being open-circuited or short-circuited by one first switch of the plurality of first switches.

8. The programmable variable gain amplifier of claim 1, wherein the plurality of second transistors are paired to form a plurality of second transistor pairs, each second transistor pair being open-circuited or short-circuited by one second switch of the plurality of second switches.

9. The programmable variable gain amplifier of claim 1, wherein the plurality of second transistors are paired to form a plurality of second transistor pairs, each second transistor of each of the plurality of second transistor pairs being open-circuited or short-circuited by one second switch of the plurality of second switches.

10. A radio frequency (RF) receiver, comprising:
a first amplifier configured to amplify an input signal;
a second amplifier comprising an output load stage, the second amplifier being configured to receive an output signal from the first amplifier and to output a first differential output signal, the output load stage comprising a plurality of first switches and a plurality of first diode-connected transistors that are open-circuited or short-circuited by the plurality of first switches;
a third amplifier comprising a current mirror input stage, the third amplifier being configured to receive the first differential output signal from the second amplifier through the current mirror input stage and to output a second differential output signal, the current mirror input stage comprising a plurality of second switches and a plurality of second transistors that are open-circuited or short-circuited by the plurality of second switches, the plurality of second transistors respectively forming current mirrors with the plurality of first diode-connected transistors corresponding to the second transistors; and
a mixer configured to mix the second differential output signal and a local oscillation signal.

11. The RF receiver of claim 10, wherein a gain of the RF receiver comprises a size ratio between one of the first diode-connected transistors and one of the second transistors.

12. The RF receiver of claim 10, wherein the second amplifier is AC-coupled to the third amplifier.

13. The RF receiver of claim 12, further comprising:
at least one additional amplifier having substantially the same configuration as the third amplifier, the at least one additional amplifier being coupled to an output stage of the third amplifier.

14. The RF receiver of claim 13, wherein an end amplifier of the at least one additional amplifier is AC-coupled to one of the third amplifier or an adjacent additional amplifier of the at least one additional amplifier.

15. The RF receiver of claim 14, wherein the mixer is AC-coupled to the end amplifier of the at least one additional amplifier.

16. The RF receiver of claim 10, wherein the plurality of first diode-connected transistors are paired to form a plurality of first transistor pairs, each first transistor pair being open-circuited or short-circuited by one first switch of the plurality of first switches.

17. The RF receiver of claim 10, wherein the plurality of first diode-connected transistors are paired to form a plurality of first transistor pairs, each first diode-connected transistor of each of the plurality of first transistor pairs being open-circuited or short-circuited by one first switch of the plurality of first switches.

18. The RF receiver of claim 10, wherein the plurality of second transistors are paired to form a plurality of second transistor pairs, each second transistor pair being open-circuited or short-circuited by one second switch of the plurality of second switches.

19. The RF receiver of claim 10, wherein the plurality of second transistors are paired to form a plurality of second transistor pairs, each second transistor of each of the plurality of second transistor pairs being open-circuited or short-circuited by one second switch of the plurality of second switches.

20. The RF receiver of claim 10, wherein the mixer comprises an I-mixer and a Q-mixer for a quadrature amplitude modulation (QAM).

* * * * *